(12) United States Patent
Pnueli et al.

(10) Patent No.: US 6,673,657 B2
(45) Date of Patent: Jan. 6, 2004

(54) KILL INDEX ANALYSIS FOR AUTOMATIC DEFECT CLASSIFICATION IN SEMICONDUCTOR WAFERS

(75) Inventors: Ayelet Pnueli, Rehovot (IL); Ariel Ben-Porath, Rehovot (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/195,769

(22) Filed: Jul. 11, 2002

(65) Prior Publication Data

US 2003/0017664 A1 Jan. 23, 2003

Related U.S. Application Data

(62) Division of application No. 09/822,919, filed on Mar. 30, 2001.

(51) Int. Cl.[7] .............................................. H01L 21/332
(52) U.S. Cl. ..................... 438/140; 438/19; 438/200; 438/218
(58) Field of Search .......................... 438/19, 140, 200, 438/218, 734

(56) References Cited

U.S. PATENT DOCUMENTS 6,091,249 A  * 7/2000 Talbot et al. ............... 324/751
6,121,156 A  * 9/2000 Shamble et al. ............ 438/734
6,130,442 A  * 10/2000 Di Zenzo et al. ........... 257/48
2002/0145606 A1 * 10/2002 Levanon et al. ............ 345/423

FOREIGN PATENT DOCUMENTS

EP          1061571     * 12/2000   ........... H01L/21/66

* cited by examiner

Primary Examiner—David Nelms
Assistant Examiner—Dao H. Nguyen
(74) Attorney, Agent, or Firm—Sughrue Mion LLP

(57) ABSTRACT

A kill index classification method for prioritizing relational aspects of topological defect intersections, particularly in association with an intermediate analytical testing stage of a multi-stage semiconductor fabrication process. The method relates to an analysis of the geometrical relationship between non-predetermined portion(s), generally referred to as defects, and the surrounding predetermined topology of a conductive semiconductor pattern, to determine the effect of defects on the functionality and reliability of a wafer, and particularly an examined die thereon. Further, in accordance with this geometrical information, a preferred classification of the effects of defects into a numerical value, the "kill index", is achieved. Preferably, this kill index is strongly linked, correlated and related to the damage caused by the defect to the functionality and/or reliability of the underlying integrated circuit.

5 Claims, 13 Drawing Sheets

KILL INDEX ANALYSIS FOR AUTOMATIC DEFECT CLASSIFICATION IN SEMICONDUCTOR WAFERS

This is a divisional of application Ser. No. 09/822,919 filed Mar. 30, 2001; the disclosure of which is incorporated herein by reference.

FIELD OF THE INVENTION

The present invention generally relates to a metric for automatic defect classification in semiconductor wafers. More specifically, for a predetermined stage in a semiconductor fabrication process, the present invention relates to a method for automatic defect classification in a die or integrated circuit of semiconductor wafers for estimating the effect of defects on functionality. Furthermore, the present invention's method of classification gives rise to new possible classes, based on the actual damage caused by a specific defect.

BACKGROUND OF THE INVENTION

Numerous methods are known and described in the literature of semiconductor fabrication process testing and quality assurance. Essentially these processes define the calculation of statistical metrics which vaguely correspond to theoretical intersections between, on the one hand, an area measure for defects and the like and, on the other hand, an area measure for the intentionally printed conductive pattern found on a predetermined region of a semiconductor wafer.

There is a need in the art for an improved method of testing and assurance, be it an improved statistical method, or an improved deterministic method, or an improved combination thereof. It should be recalled that another critical aspect of semiconductor testing and assurance relates to the amount of time consumed by such a method. In terms of an in process testing and assurance method, speed is of the essence. Therefore, a reduction of delays in process testing would likewise represent a significant improvement to the art. Furthermore, an improved testing and assurance method that will facilitate reprocessing of defective batches of wafers would also constitute an improvement to the prior art.

There is a further need in the art to classify defects on semiconductor wafer layers or dies in terms of the relationship between the defects and the surrounding conductive patterns, and to classify defects in terms of their effect on production yield. Additionally, there is a need in the art for the classification of defects relating to missing conductive patterns or portions thereof.

The present invention will be described with the requisite particularity based on preferred embodiments. However, those versed in the art will readily appreciate that various modifications and alterations may be carried out without departing from either the spirit or scope, as hereinafter claimed.

In describing the present invention, explanations are presented in light of currently accepted scientific Technological or Process Control theories and models. Such theories and models are subject to changes, both adiabatic and radical. Often these changes occur because representations for fundamental component elements are developed, because new transformations between these elements are conceived, or because new interpretations arise for these elements or for their transformations. Therefore, it is important to note that the present invention relates to specific technological actualization in embodiments. Accordingly, theory or model dependent explanations herein, related to these embodiments, are presented for the purpose of teaching ordinarily skilled artisans how these embodiments may be substantially realized in practice. Alternative or equivalent explanations for these embodiments may neither deny nor alter their realization.

In addition, the following definitions will be useful for understand the invention as described herein:

Kill Index: Generally, the kill index is a descriptor carrying information regarding the estimated kill rate of a defect. A "kill rate" implies a rate, which is an average (i.e. statistical entity)—and statistical decision making is often employed using a kill rate in order to determine the fate of a batch according to an examination and classification of a few constituent members of that batch. Nevertheless, the "Kill Index", per se, is not a statistical measure. It is a deterministic metric, derived from the topological relationship between the defect and surrounding imprinted pattern objects, that is related to the damage caused by this defect to the specific integrated circuit. "Kill" is used to denote a dysfunctional integrated circuit.

Killer Defect: A defect, which renders a single die (which corresponds to a single integrated circuit) or portions thereof unable to function adequately or reliably.

Pattern blobs: Distinct pattern areas in a wafer layer or die, defined by a continuous border separating them from the background; for example conductive pattern portions in a wafer layer.

Reference Image: A magnified segment of a layer or die of a semiconductor wafer having no defects either relating to faults in the predetermined topology of the pattern or to additional particles.

Defect Image: A magnified segment of a layer or die of a semiconductor wafer having defects either relating to faults in the predetermined topology of the pattern or to additional particles.

Reference Map: A predetermined image mask of the required pattern topology of each layer of a semiconductor wafer.

Reference Rule Set: A protocol relating to definitions of the geometric shapes and sizes of elements of the topology of a layer or die of a semiconductor wafer such as a straight edge, a specific curvature, intersecting angles and specific lengths.

Non-predetermined Portion: Defects in a semiconductor wafer or layer thereof, random with respect to position even if systematic with respect to process.

Also, the following acronyms are referred to in the following description:

ADC: Automatic defect classification.
CDM: Chamfer distance map.
DFP: Defect's footprint.
EDS: Electron dispersion spectroscopy.
FOV: Field of view.
IPDM: Integer pattern dilated map.
ND: Number of dilations.
PBM: Pattern binary map.
PCZSM: Pattern Complement Zoomed Segment Map (ZSM).
RCFR: Reference to class FOV ratio.
SEM: Scanning Electron Microscopy.
ZSM: Zoomed Segment Map.

SUMMARY OF THE INVENTION

In the process of manufacturing semiconductor wafers, quality control and assurance testing of all parameters is needed after each processing step. An important aspect of this testing relates to classification and detection of the presence and location of defects resulting from the previous manufacturing step. Furthermore, it is necessary to determine if such defects will render the currently exposed layer, die or integrated circuit of the wafer, or presumptively a batch of wafers, incapable of functioning adequately and reliably. Defects that result in a batch of wafers being unsatisfactory are termed "killer defects". This stage-wise testing and defect classification procedure relates to the exposed layer portion of each wafer subsequent to each manufacturing step.

The present invention relates to embodiments of a kill index classification method for prioritizing relational aspects of topological defect intersections, particularly in association with an intermediate analytical testing stage of a multi-stage semiconductor fabrication process. This method includes the steps of
a) locating a region having at least one non-predetermined portion therein;
b) determining a predetermined topology for the region;
c) calculating evaluation parameters based on the at least one non-predetermined portion in relation to the predetermined topology for the region; and
d) assigning a kill index classification using the calculated evaluation parameters.

More specifically, the kill index that is assigned is linked, correlated and related to the damage caused by the defect to the functionality and/or reliability of the underlying integrated circuit.

Simply stated, the method relates to an analysis of the geometrical relationship between a non-predetermined portion, generally referred to as defects, and the surrounding predetermined topology of the conductive semiconductor pattern, to determine the effect of defects on the functionality and reliability of the currently exposed layer, die or integrated circuit of the wafer. Further, in accordance with this geometrical information, a classification of the effects of defects into a numerical value, the "kill index", is achieved.

According to an embodiment of the present invention, the kill index classification method in which the step of locating a region having at least one non-predetermined portion therein includes the steps of
a) accepting at least one appropriate resolution image of the region and
b) using the at least one appropriate resolution image analyzing the region to determine if there is a rule violating shaped portion located therein.

According to a variation of an embodiment of the present invention, the kill index classification method in which the step of accepting at least one appropriate resolution image of the region includes the steps of accepting a reference image, and accepting a defect image. Furthermore, the step of analyzing the region to determine if there is a rule violating shaped portion located therein includes the step of comparing the reference image with the defect image.

According to another variation of an embodiment of the present invention, the kill index classification method in which the step of accepting at least one appropriate resolution image of the region includes the steps of accepting a reference map, and of accepting a defect image. Additionally, the step of analyzing the region to determine if there is a rule violating shaped portion located therein includes the step of comparing the reference map with the defect image.

According to an additional variation of an embodiment of the present invention, the kill index classification method in which the step of accepting at least one appropriate resolution image of the region includes the steps of accepting a reference rule set, and of accepting a defect image. Furthermore, the step of analyzing the region to determine if there is a rule violating shaped portion located therein includes the step of comparing the reference rule set with the defect image.

According to a variant of an additional variation of the abovementioned embodiment of the present invention, the kill index classification method in which the step of accepting a reference rule set includes a threshold for at least one topological feature selected from the list of a detected edge discontinuity, a detected edge curvature, an interior angle formed from two intersecting detected edges, an exterior angle formed from two intersecting detected edges, a fabrication mask topology design principle, or the like.

Simply stated, in the application of this embodiment of the present invention, a set of rules or standards, generally geometric in nature, replaces or supplements the use of a defect-free reference image on a reference map segment to determine the existence of defects. This technique facilitates detection of defects relating to pattern deformation, additional patterns and absence of pattern portions as well as detection of defects such as unwanted particles.

According to another embodiment of the present invention, the kill index classification method, having the step of determining a predetermined topology for the region, includes at least one step selected from the list of examining a reference image, examining a reference map, or examining a fabrication mask topology design algorithm methodology used to produce the reference map.

According to an additional embodiment of the present invention, the kill index classification method in which the step of calculating evaluation parameters based on the at least one non-predetermined portion in relation to the predetermined topology for the region includes the step of assigning a topology intersection parameter for the juxtaposition of the at least one non-predetermined portion with the predetermined topology.

According to a further embodiment of the present invention, the kill index classification method in which the step of assigning a kill index classification using the calculated evaluation parameters includes convoluting the calculated evaluation parameters into a numeric classification.

Furthermore, according to an embodiment of the present invention, the kill index classification method in which the step of assigning a kill index classification using the calculated evaluation parameters includes convoluting the calculated evaluation parameters into a multi-parametric classification coordinate.

Simply stated, a kill index relating to the relative positions of defects and pattern is specified substantially as a numerical value or as a chart of these factors or as a three-dimensional metric, as a multi-parametric function or the like.

According to another embodiment of the present invention, the kill index classification method in which the step of locating a region having at least one non-predetermined portion therein includes locating a region having at least one defect footprint. According to a variation of an embodiment of the present invention, the kill index classification method in which locating a region having at least one defect footprint includes locating a region having at least one multi-component footprint. This implies that a defect footprint includes the presence of multiple defects and not simply the largest or most significant defect.

Moreover, according to yet a further embodiment of the present invention, the kill index classification method in which the step of calculating evaluation parameters based on the at least one non-predetermined portion in relation to the predetermined topology for the region includes the at least one non-predetermined portion having at least one non-predetermined portion core class of at least one pattern non-predetermined portion selected from the group comprising an extra pattern connected, an extra pattern isolated, a missing pattern, a deformed pattern and the like. Alternatively, at least one particle-non-predetermined portion includes an element selected from the group comprising a crater in the pattern, a crater in the background, a particle on the pattern, a particle on the background, a particle on distortion, an embedded under pattern, or an embedded under background.

According to a further embodiment of the present invention, the kill index classification method in which the step of calculating evaluation parameters based on the at least one non-predetermined portion in relation to the predetermined topology for the region the evaluation parameters include at least one parameter selected from the list:

a) a non-predetermined portion isolated from the predetermined topology;
b) a non-predetermined portion close to the predetermined topology;
c) a non-predetermined portion connected to the predetermined topology;
d) a non-predetermined portion bridging the predetermined topology; and
e) a non-predetermined portion close to bridging the predetermined topology.

More specifically, the relative distance between a defect particle and an adjacent pattern is relevant to whether the defect will adversely affect the functionality of a wafer. Generally, defect particles at a sufficiently large distance from the pattern, will not interfere with functionality. Similarly, a particle close to or connected to a single pattern portion or blob is unlikely to cause a problem. Clearly, a particle causing a short across two or more pattern blobs by bridging is problematic, and such a defect is classified as a "killer defect". Where a defect particle is defined as close to bridging, whether this will be termed a killer defect, depends on whether the closeness is of the order of a single pixel in the defect map, making distinguishing between touching and close problematic.

According to a variation of the abovementioned embodiment of the present invention, the non-predetermined portion isolated from the predetermined topology includes a distance greater than a predetermined distance between the at least one non-predetermined portion and a pattern portion of the predetermined topology.

According to another variation of the aforementioned embodiment of the present invention, the non-predetermined portion close to the predetermined topology includes a distance less than a predetermined distance between the at least one non-predetermined portion and a pattern portion of the predetermined topology.

According to an additional variation of the aforementioned embodiment of the present invention, the non-predetermined portion connected to the predetermined topology includes the at least one non-predetermined portion being in contact with a pattern portion of the predetermined topology.

According to a further variation of the aforementioned embodiment of the present invention, the non-predetermined portion bridging the predetermined topology includes at least one parameter selected from the list:

a) at least one non-predetermined portion connecting at least two pattern portions of the predetermined topology;
b) at least one non-predetermined portion connecting at least one pattern portion and intersecting at least one other pattern portion of the predetermined topology; and.
c) at least one non-predetermined portion intersecting at least two pattern portions of the predetermined topology.

According to another variation of an embodiment of the present invention, the non-predetermined portion close to bridging the predetermined topology includes the at least one non-predetermined portion being close to at least two pattern portions of the predetermined topology.

Generally there are two basic embodiment families of the present invention, which relate to assigning a kill index classification for any imaged region of the exposed layer of an in-process wafer. One of these families relates to the exposed layer as a two-dimensional image while the other uses relative height information for each pixel or pixel-cluster in the image to provide a more refined kill index classification. Each of these basic embodiment families can be adapted for use in the context of any explicitly described embodiments, variants, and so on.

It should be recalled that the killer index classification of the present invention is preferably used in conjunction with a system for specifying the material properties (conductive, capacitive, resistive, non-conductive and so on) of each mapped pixel or pixel-cluster in a critical process control decision such as disqualifying the currently exposed layer, die or integrated circuit of the wafer or wafer batch or directing a wafer batch to a corrective step such as pattern stripping or reworking.

BRIEF DESCRIPTION OF THE DRAWINGS

In order to understand the invention and to see how it may be carried out in practice, embodiments including the preferred embodiment will now be described, by way of non-limiting example only, with reference to the accompanying drawings, in which:

FIG. 17 illustrates a schematic view of a system for operating a multi-stage semiconductor fabrication process wherein is included at least one embodiment of the kill index classification method of the present invention.

DETAILED DESCRIPTION OF EMBODIMENTS

Figure 1A:
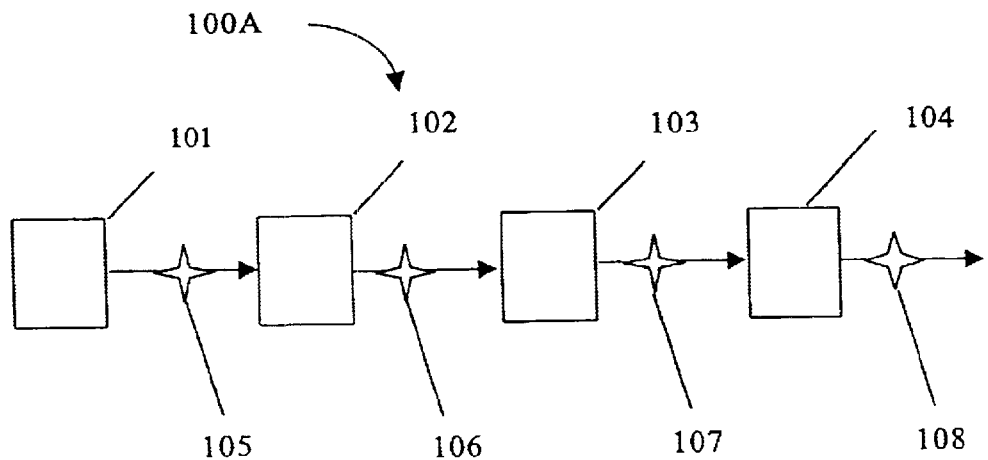
FIG. 1A illustrates a flow diagram of a wafer production and inspection process.

In the manufacture of semiconductor wafers, it is necessary to subject as many parameters as possible to quality control at every step in the manufacturing process. FIG. 1A is a flow diagram 100A indicating some of the steps 101, 102, 103 and 104 in the manufacturing process. These steps 101–104 are not specified, but are well known to the ordinarily skilled artisan, and need not be detailed here. Control checks 105, 106, 107 and 108 are carried out on random defects, generally "dirt" particles, extra pattern segments or missing pattern segments, after each manufacturing step on the most recently created exposed layer. This quality control procedure is statistical, and is not carried out on every item manufactured. Furthermore, testing is automated and not performed by an operator.

Figure 1B:
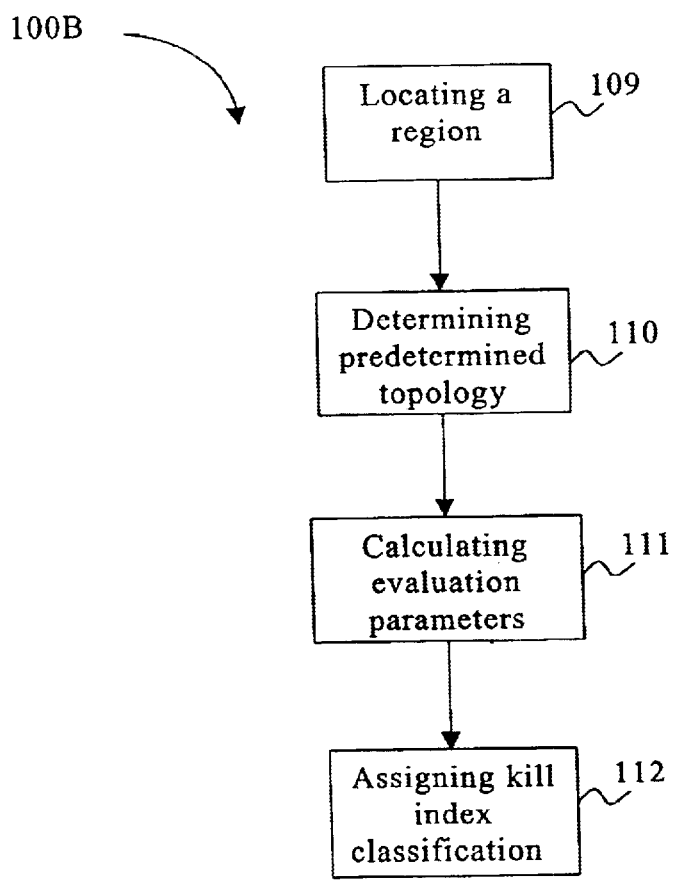
FIG. 1B illustrates a schematic view of the most general embodiment of the kill index classification method of the present invention.

In this context (turning to FIG. 1B), the present invention relates to embodiments of a kill index classification method 100B—for example, such as 105, 106, 107 and 108 in 100A—for prioritizing relational aspects of topological defect intersections, particularly in association with an intermediate analytical testing stage of a multi-stage semiconductor fabrication process. This method includes the steps of a) locating (step 109) a region having at least one non-predetermined portion therein;

b) determining (step 110) a predetermined topology for the region;

c) calculating (step 111) evaluation parameters based on the at least one non-predetermined portion in relation to the predetermined topology for the region; and d) assigning (step 112) a kill index classification using the calculated evaluation parameters.

A defect in a currently exposed layer, die or integrated circuit of the wafer, which renders a wafer unable to function adequately or reliably, is termed a "killer defect". Generally, there are two types of killer defects: defects that "short" between pattern blobs; and defects that cause a "disconnection". A significant question, with regard to a step by step quality control procedure, is whether a specific defect will or will not have the effect of "killing" the currently exposed layer, die or integrated circuit of the wafer. It is necessary that a wafer manufacturer be able to detect the presence of any defect, the location of such defects, and whether these defects are "killer defects". Generally there are defects that may be ignored by the manufacturer, while killer defects are extremely important, so that even a small number cannot be tolerated.

If the spread of defects were completely random, information regarding yield would be obtainable in terms of the defect classification and size. However, in practice, defect distribution is not necessarily random.

Knowing the presence and location of a "killer defect" at various stages in the manufacturing process is additionally significant, in that this knowledge will facilitate reworking of a defective batch of wafers to effect recovery of these wafers.

Defects Types

The initial stage of the scheme for core classification of defects is the differentiation between "particle" and "pattern" defects. Thereafter, each class needs to be separately defined.

Particle Defects are defined as defects such as:

Crater In Pattern,

Crater In Background,

Particle On Pattern,

Particle On Background,

Particle On Distortion,

Embedded Under Pattern,

Embedded Under Background.

Pattern Defects are defined as core classes such as:

Extra Pattern Connected,

Extra Pattern Isolated,

Missing Pattern, and

Deformed Pattern.

Figure 2:
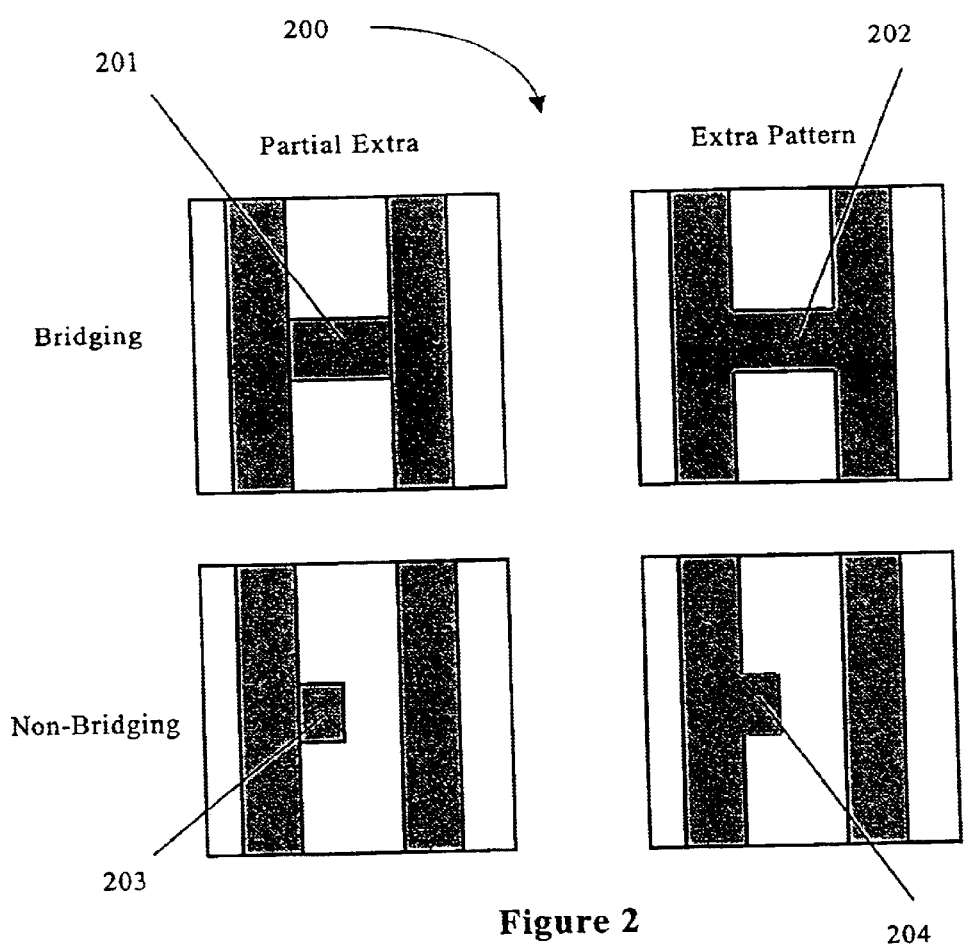
FIG. 2 illustrates a schematic view of the notion of "connectivity"

FIG. 2 illustrates a schematic view 200 of the notion of "connectivity". By redefining the notion of "connectivity", for example, the two defects 201 and 202 are both categorized as "killer defects". Currently, defect 201 is classified as "extra pattern isolated", and defect 202 is classified as "extra pattern connected". The same classifications apply to the defects 203 and 204, which are both non-bridging pattern defects.

In addition to the core classification, the output of the classification contains the "segment level" of the defect: for particles, the segment level contains the segments on which the defect lies (a "segment" can be pattern 1, background or pattern 2). For pattern defects, additional information regarding which pattern is extra or missing is included.

Extra Material Defects

Figure 3:
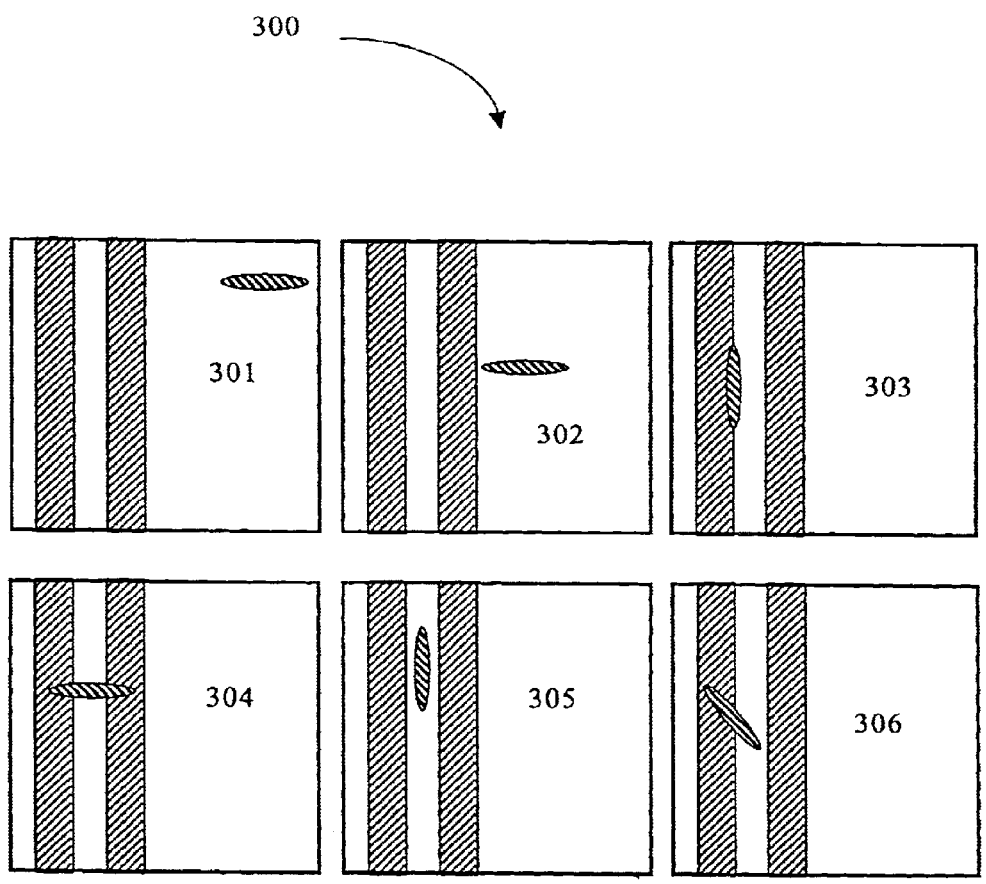
FIG. 3 illustrates schematic views demonstrating an isolated defect, a defect close to the pattern, a defect connected to the pattern, a defect bridging across two pattern blobs, a defect close to bridging and another defect connected to a pattern blob and close to bridging across another.

FIG. 3 illustrates schematic views 300 demonstrating an isolated defect 301, a defect close to the pattern 302, a defect connected to the pattern 303, a defect bridging across two pattern blobs 304, a defect close to bridging 305 and another defect connected to a pattern blob and close to bridging across another 306. A defect (either a pattern or a particle defect) is defined as "connected" if it touches the pattern; "isolated" if it is far away from the pattern; and "close to pattern" if it does not touch the pattern, but is close to it.

A defect is "bridging" if it connects two (or more) pattern areas. A defect is "close to bridging" if it is either connected to one pattern area and close to another, or close to two pattern areas.

Figure 4:
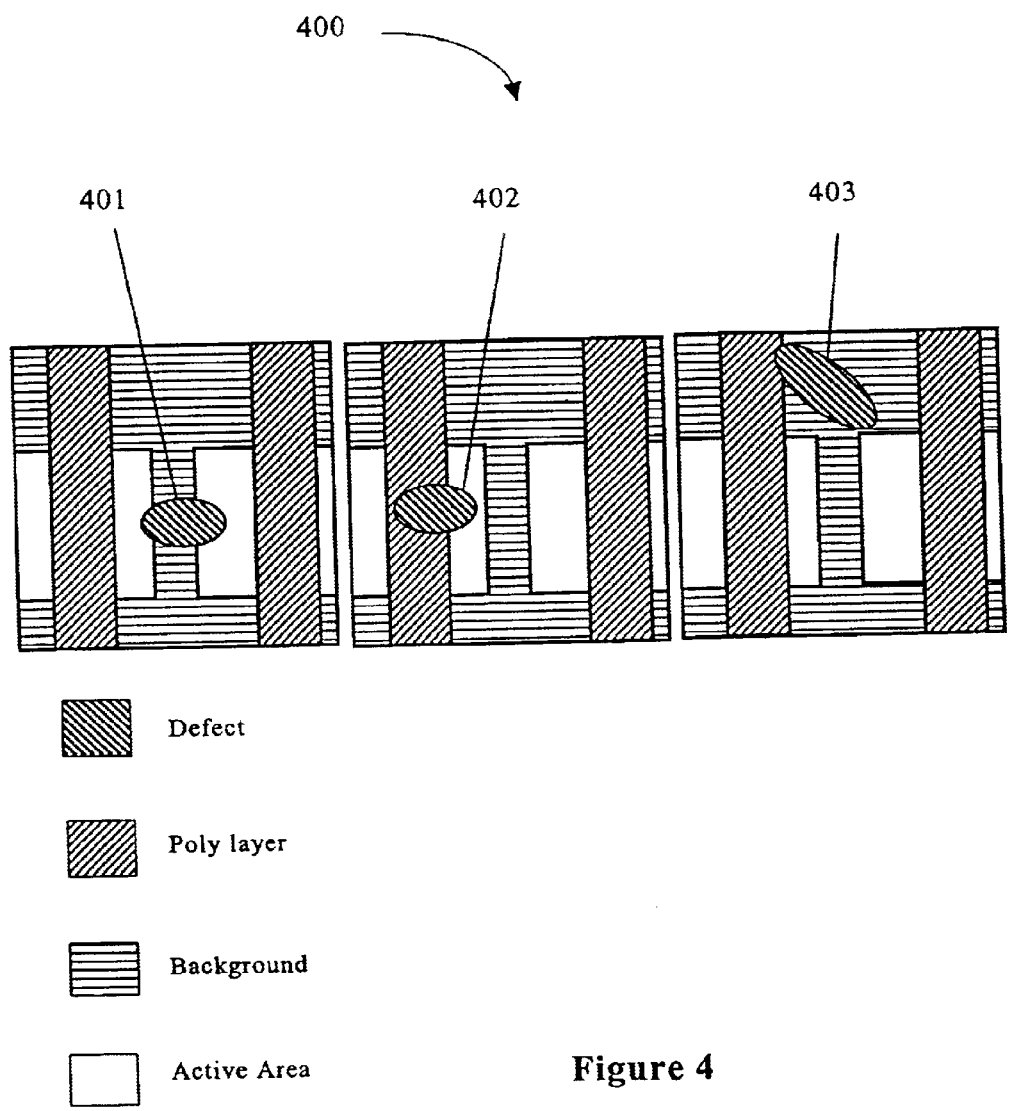
FIG. 4 illustrates a schematic view demonstrating bridging, connected and close to bridging.

For two pattern layers (poly layers), the definition has to be somewhat modified. FIG. 4 illustrates a schematic view 400, demonstrating bridging 401, connected 402 and close to bridging 403 for two pattern layers. The definition of connectivity remains substantially the same. The only change, in this case, is that a defect can be connected to pattern 1, pattern 2 or both. For a definition of bridging, pattern 1 and pattern 2 are treated as one-segment, in which case, the same definition as above applies.

Missing Pattern Defects

All extra pattern defects are concerned with "extra material" defects (or missing material which caused a connection to a previous layer pattern). The situation with a "missing pattern" is slightly different. Firstly, a missing pattern is always "connected"—a pattern can be missing only where there should be a pattern. Secondly, a missing pattern defect is not necessarily a killer—the "kill rate" depends on the defect size relative to the pattern "size" (width for a line, area for a contact and so on). With regard to a missing pattern, the definitions of pattern and background are effectively reversed.

Pattern defects include pattern deformed/broken, pattern deformed/continuous, pattern deformed/bridging and pattern deformed/close as well as pattern missing/completely and pattern missing/partially. If the defect cuts off a pattern line, if a deformed pattern causes bridging or if a contact is completely missing, the defect is a killer.

Non-Killers Bridging Defects

There are defects that cannot create shorts, unless they are "high". An example of this non-killer defect class is a micro-scratch: a shallow micro-scratch does not "bridge" patterns. For such classes, bridging information will not be added to the defect core class.

Defect Location

Figure 5:
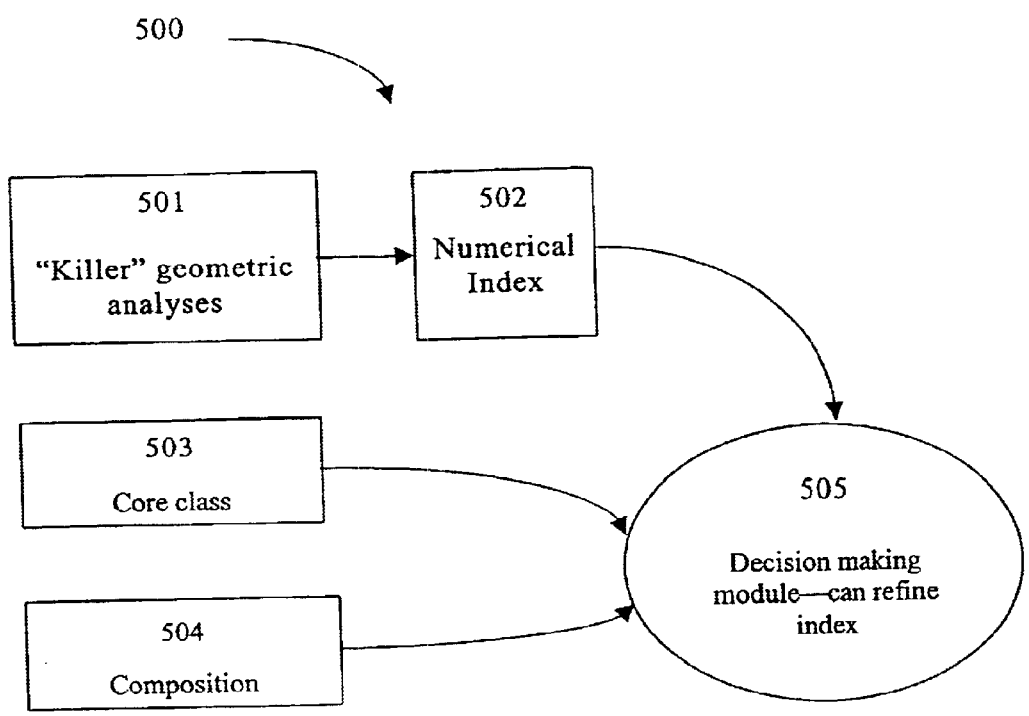
FIG. 5 illustrates a flow diagram of the quality control decision making process.

FIG. 5 illustrates a flow diagram 500 of the quality control decision making process, wherein the "killer" geometric analysis 501 gives rise to a numerical index 502 indicating the defect classification. Furthermore, information regarding the core class 503, (that is, the magnified details of defects) and the defect composition 504 all contribute to a decision-making module 505, which enables the refining of the index information.

The core class encodes two kinds of information: the defect "type", and defect "location". Not included in the core classification is information relating to "bridging" (the defect connects different pattern pieces), "close" (the defect is not connected to the pattern, but it is very close to it), and so on. This information is not connected with the "root cause" of the defect, but nonetheless is very helpful for deciding the kill rate of a defect.

Figure 6:
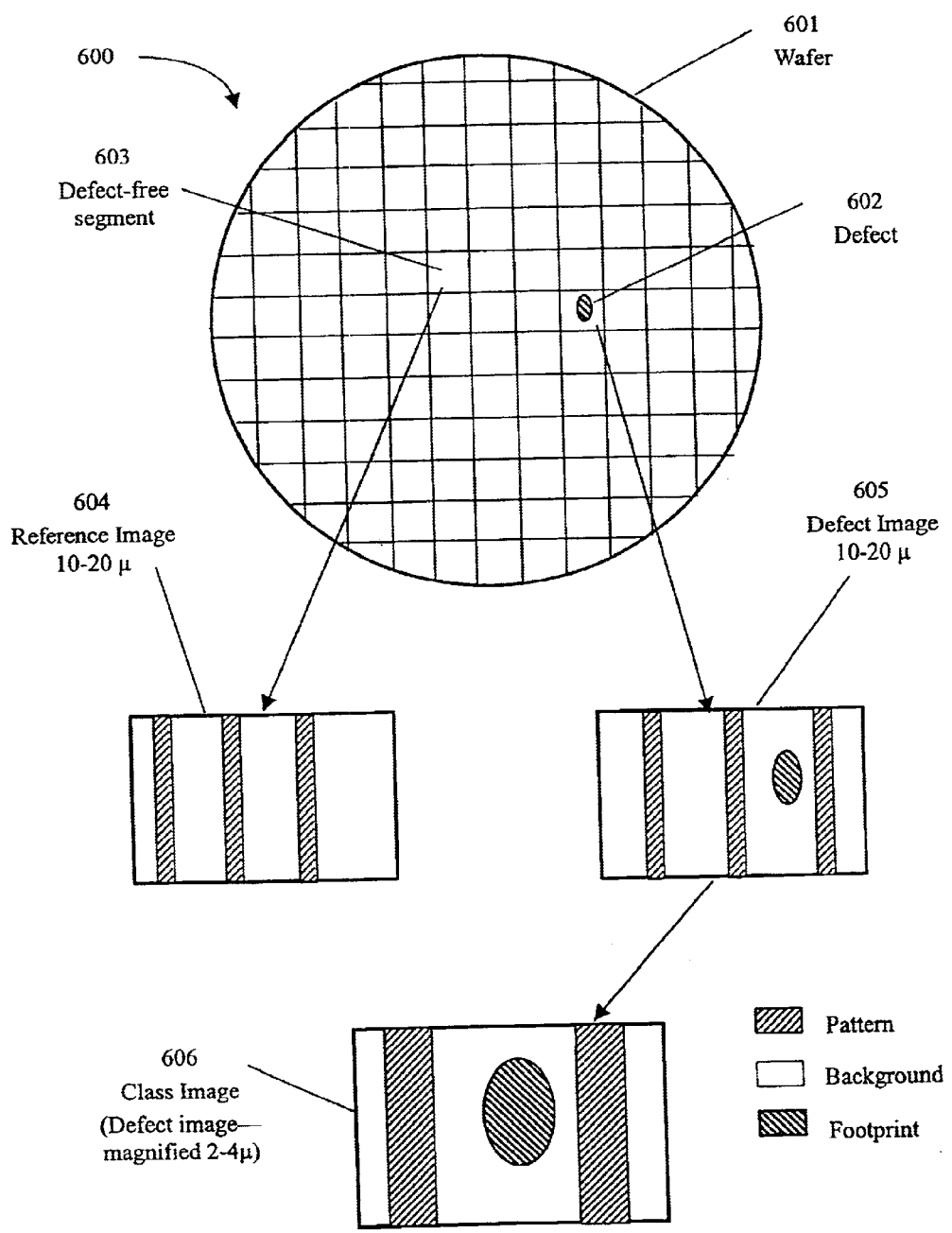
FIG. 6 illustrates a flow diagram of the preparation of a class image.

FIG. 6 illustrates a flow diagram 600 of the preparation of a class image 606. In order to evaluate the "killer" effects of defects, it is necessary to examine defective segments from the segment map of the currently exposed layer, die or integrated circuit of the wafer 601. A defect free reference segment image 604, generally about 10 to 20 micron ($\mu$L) in size, is used to comparatively determine the presence of defects on a defect image 605. When such a defect image is detected, the image is dilated to more clearly show the magnified defect in the Class Image 606 which is a 2 to 4 micron segment of the wafer segment map. The defect footprint (DFP) shows the shape and size of the defect as well as its position relative to the pattern blobs in the class image. Using this class image, the Kill Index for the class image is determined.

Kill Index

The Kill Index is a descriptor, which describes the geometrical relationship between the defect and the surrounding pattern object for the purpose of estimating the effect of the defect on the functionality and/or reliability of the wafer. The Kill Index is based largely on the segmentation map and the defect's footprint (DFP). The "footprint" refers to the multi-component DFP, and not only to the largest component.

More specifically, the kill index that is assigned is linked, correlated and related to the damage caused by the defect to the functionality and/or reliability of the underlying integrated circuit.

Figure 7:
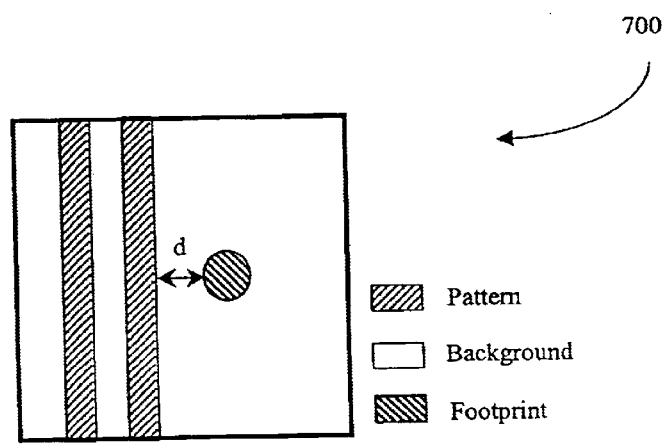
FIG. 7 illustrates a schematic view of a defect not touching the pattern.
Figures 8A, 8B, 8C:
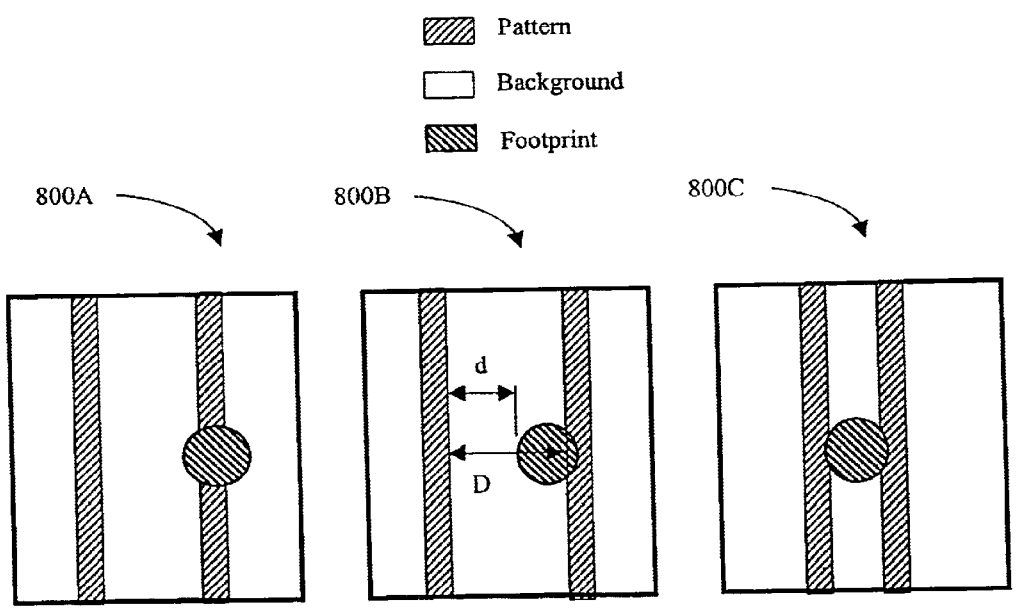
FIG. 8A illustrates a schematic view of a defect connected to a pattern blob.
FIG. 8B illustrates a schematic view of a defect close to bridging two pattern blobs.
FIG. 8C illustrates a schematic view of a defect bridging two pattern blobs.

FIG. 7 illustrates a schematic view 700 of a defect not touching the pattern. Furthermore, FIG. 8A illustrates a schematic view 800A of a defect connected to a pattern blob, FIG. 8B illustrates a schematic view 800B of a defect close to bridging two pattern blobs and FIG. 8C illustrates a schematic view 800C of a defect bridging two pattern blobs.

Figure 9:
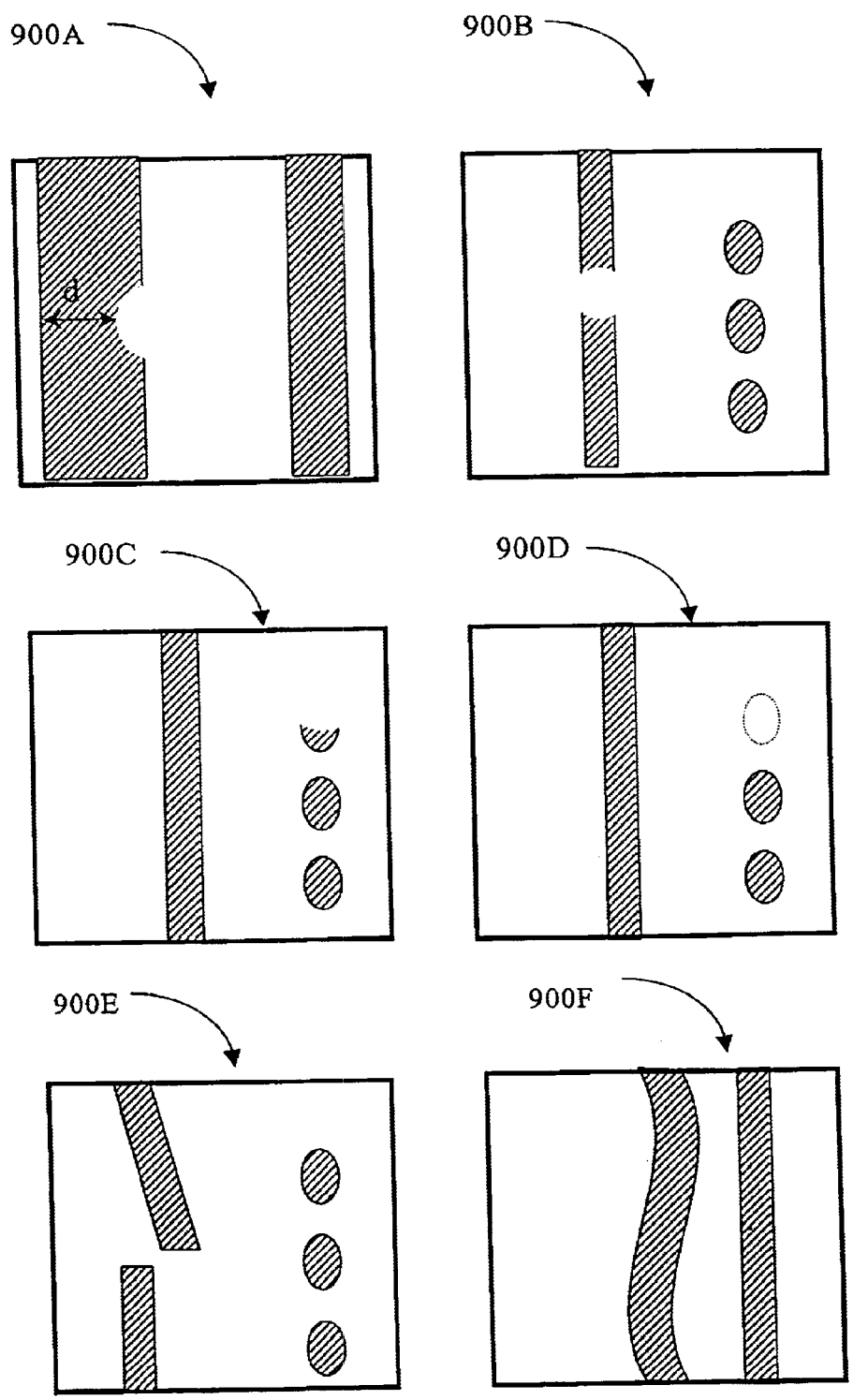
FIG. 9 illustrates a schematic view of various missing pattern and deformed pattern defects.

FIG. 9 illustrates a series of schematic views of missing pattern 900A, 900B, 900C and 900D and deformed pattern 900E and 900F defects.

View 900A illustrates a missing pattern close to a disconnected defect where "d" is a measure of the closeness to disconnection, which is not necessarily a killer defect.

View 900B illustrates a missing pattern disconnection defect which is classified as a killer defect.

View 900C illustrates an almost missing contact.

View 900D illustrates a missing contact which is classified as a killer defect.

View 900E illustrates a deformed pattern defect which is classified as a killer defect.

View 900F illustrates a deformed pattern defect.

The Kill Index is defined according to the following criteria:

If the defect's footprint does not touch the pattern, as in schematic view 700 in FIG. 7, the kill index is negative, and its absolute value is equal to the distance "d", in microns, between the footprint and the pattern closest to it. For example, a kill index of minus 6 would indicate a defect footprint 6 microns distant from and not touching a pattern blob.

If there is no pattern in the class image, distance "d" is set to the field of view (FOV) of the class image, that is, typically 480 pixels.

If the footprint touches the pattern, as in 800A, 800B and 800C in FIGS. 8A, 8B, and 8C, respectively, the kill index is greater than or equal to one. The kill rate counts the number of pattern blobs which the footprint touches. For a kill rate greater than or equal to 2, the inference is that the defect footprint shorts at least two adjacent pattern blobs or segments, effectively creating a single blob.

If the footprint touches a pattern blob, as in 800B and is close to an adjoining pattern blob, the kill index is equal to 1+(D−d)/D (alternatively stated as (2D−d)/D), where "D" is the distance between the adjacent pattern blobs in the vicinity of the defect footprint and "d" is the distance between the defect footprint and the adjacent close pattern blob.

Algorithm To Calculate The Kill Index "N"

Figure 10:
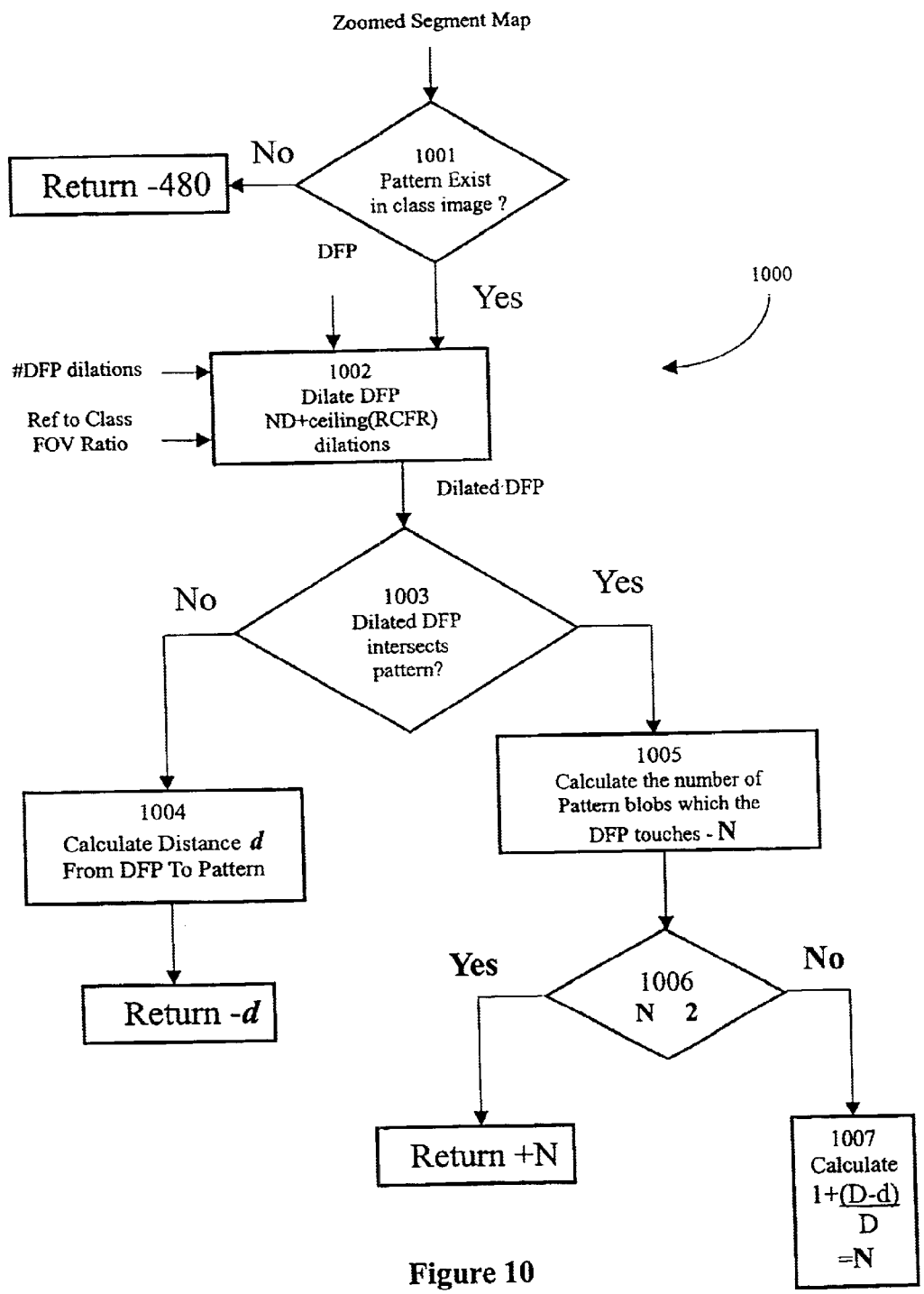
FIG. 10 illustrates a flow diagram of the algorithm to determine the kill index.

FIG. 10 illustrates a flow diagram 1000 of the algorithm to determine the kill index.

The main steps of the algorithm are:

Step 1001; Check if there is pattern in the class image. If there is not, return a large negative value equal to the FOV of the class image, typically 480 pixels.

Step 1002: If there is a pattern in the class image, dilate the DFP.

Step 1003: Check if the footprint intersects the pattern.

Step 1004: If there is not, then calculate the distance d, between the pattern and the footprint, and return −d.

Step 1005: If the footprint intersects the pattern in step 1003, calculate how many pattern blobs, N, the footprint touches or intersects.

Step 1006: If N is greater than or equal to 2, return N as the killer index.

Step 1007: If N is not greater than or equal to 2, calculate the kill index, N=1+(D−d)/D.

Figure 11:
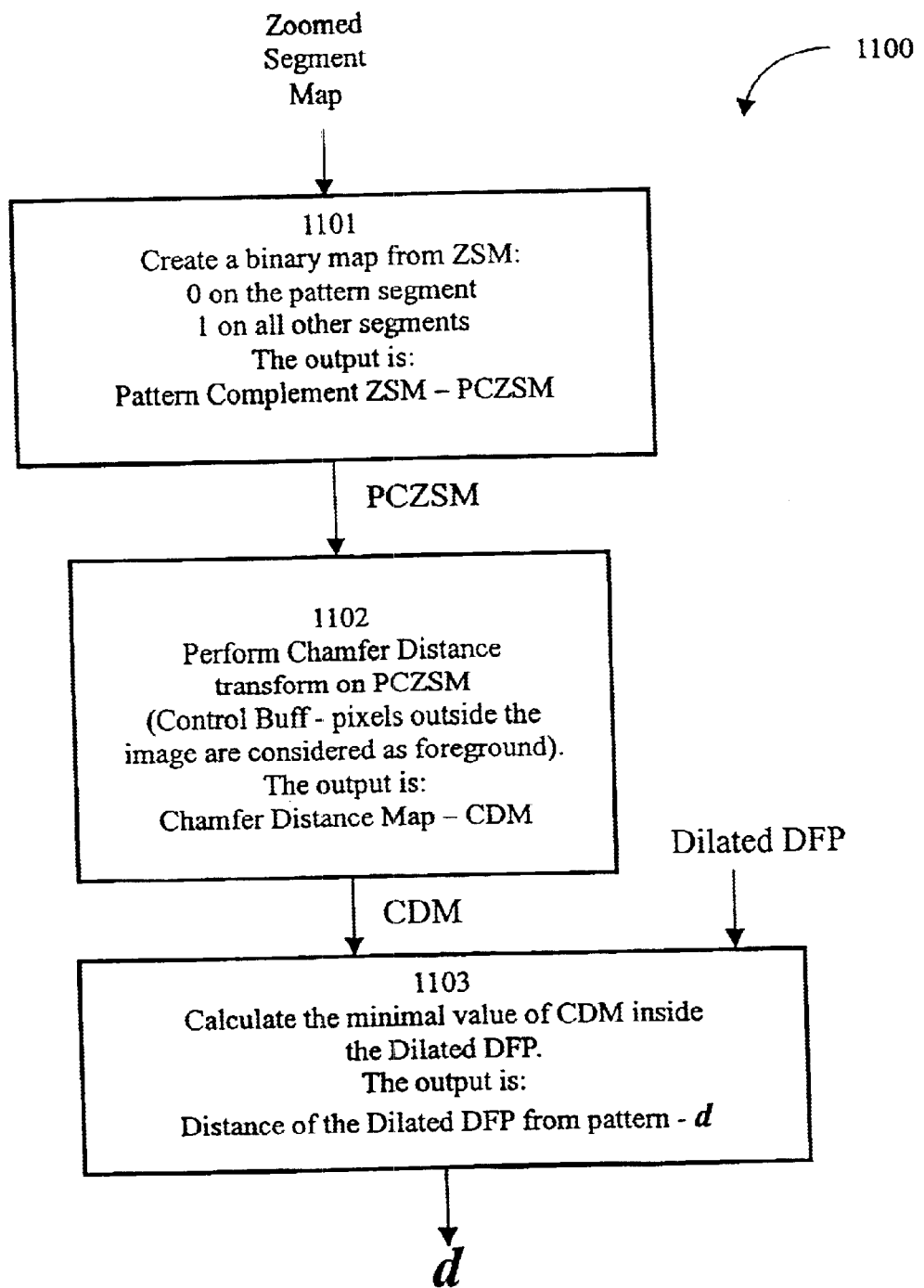
FIG. 11 illustrates a flow diagram of the procedure to calculate the distance of a dilated DPF to a pattern blob.

Calculation of Distance d from a Dilated DFP to a Pattern:
FIG. 11 illustrates a flow diagram 1100 of the procedure to calculate the distance from a dilated DPF to a pattern. The steps indicated are:

Step 1101: From a Zoomed Segment Map (ZSM), create a binary map, the output of which is a Pattern Complement ZSM (PCZSM).

Step 1102: Perform a chamfer distance transform on PCZSM, the output of which is a Chamfer Distance Map (CDM).

Step 1103: From the dilated DFP, calculate the minimal value of CDM inside the dilated DFP, the output of which is the distance d of the dilated DFP from the pattern.

Figure 12:
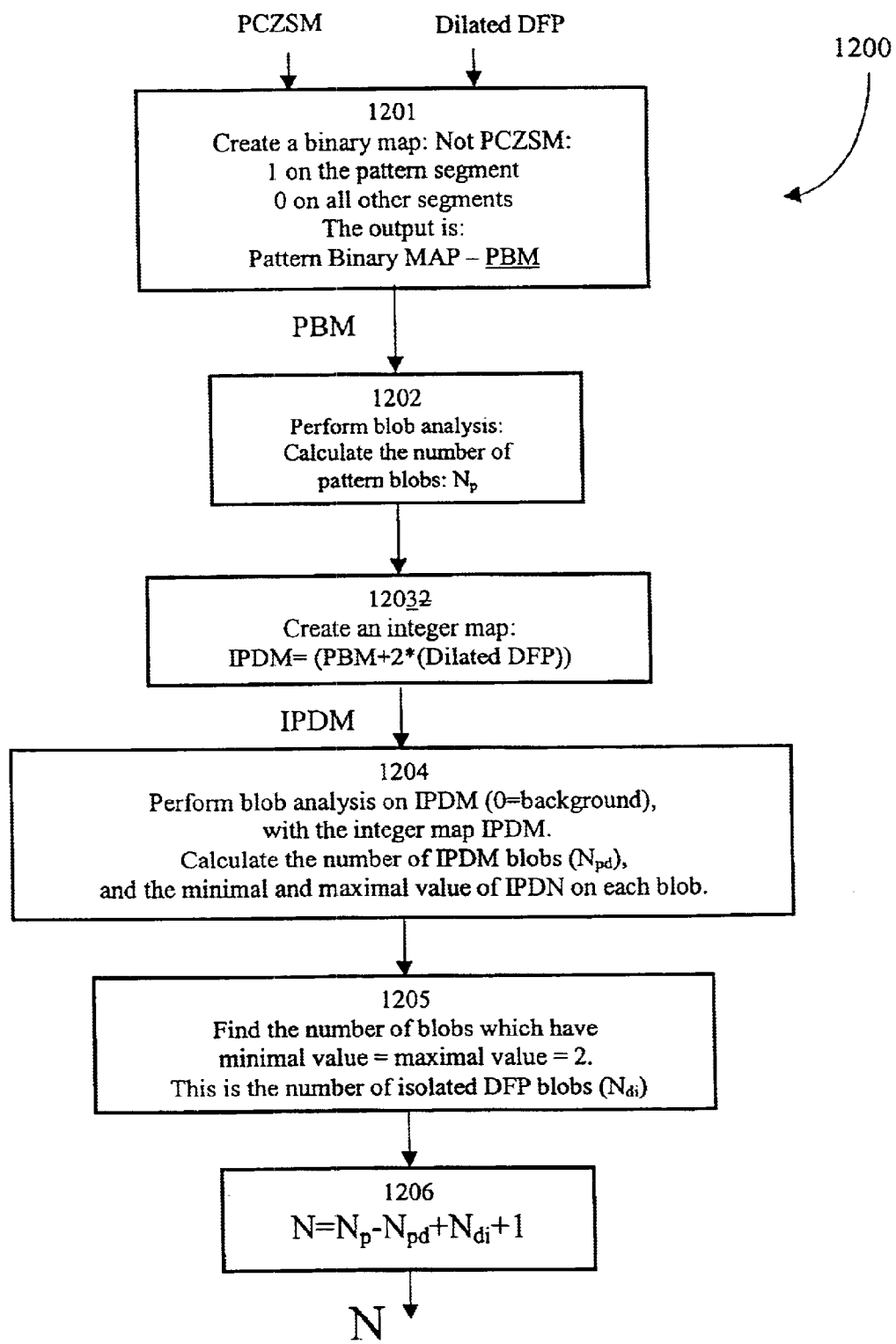
FIG. 12 illustrates a flow diagram of the procedure to calculate the Kill Index, i.e. the number of pattern blobs which the DFP shorts.

Calculation of the Kill Index N:
FIG. 12 illustrates a flow diagram 1200 of the procedure for calculating the Kill Index, that is, the number of pattern blobs, which the DFP shorts. The calculation steps include:

Step 1201: From the PCZSM and the dilated DFP, create a binary map, the output from which is a Pattern Binary Map (PBM).

Step 1202: Perform a pattern blob analysis to calculate the number of pattern blobs, $N_p$.

Step 1203: Create an integer map, where IPDM=(PBM+2*(Dilated DFP)).

Step 1204: Perform a blob analysis on the IPDM and calculate the number of pattern and defect footprint blobs, $N_{pd}$. Also calculate the minimum and maximum value of IPDM on each blob. It should be noted that this calculation creates the inference that each short between pattern blobs reduces the total number of blobs by one. However, if the defect is a multi-component defect, each isolated component increases $N_{pd}$ by one.

Step 1205: Find the number of isolated DFP blobs, i.e. those having minimum value=maximum value=2, and the number of isolated DFP blobs is $N_{di}$.

Step 1206: Calculate the kill index N, from the number of pattern blobs which the DFP shorts from the formula:

$$N=N_p-N_{pd}+N_{di}+1$$

(the added "1" is to allow that a defect which touches a pattern segment will give rise to a kill index of one, implying that there is no reduction in the number of pattern blobs due to shorting by any DFP).

Figure 13:
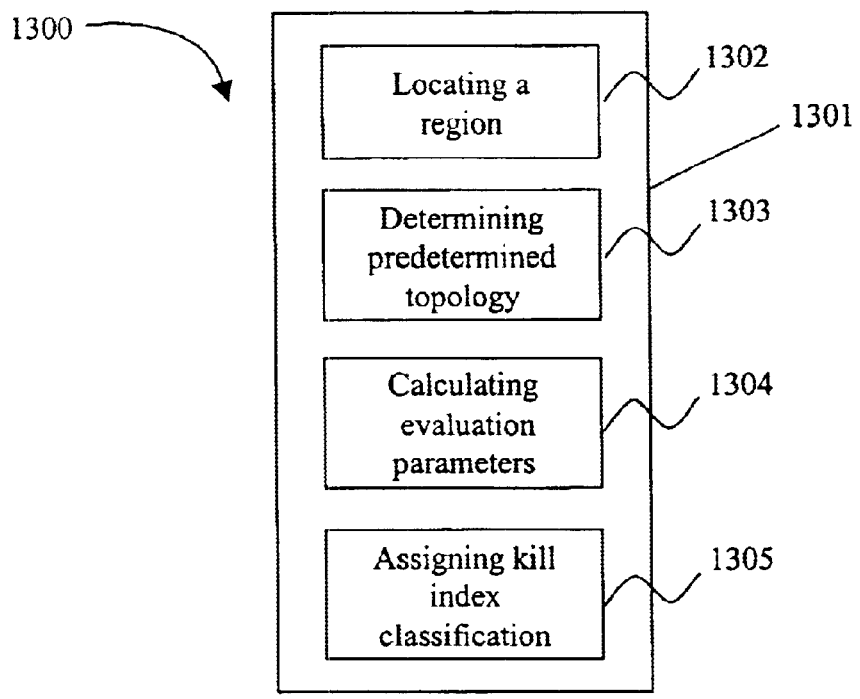
FIG. 13 illustrates a schematic view of a computer program product including a computer usable medium having computer readable program code embodied therein for the kill index classification method of the present invention.
Figure 14:
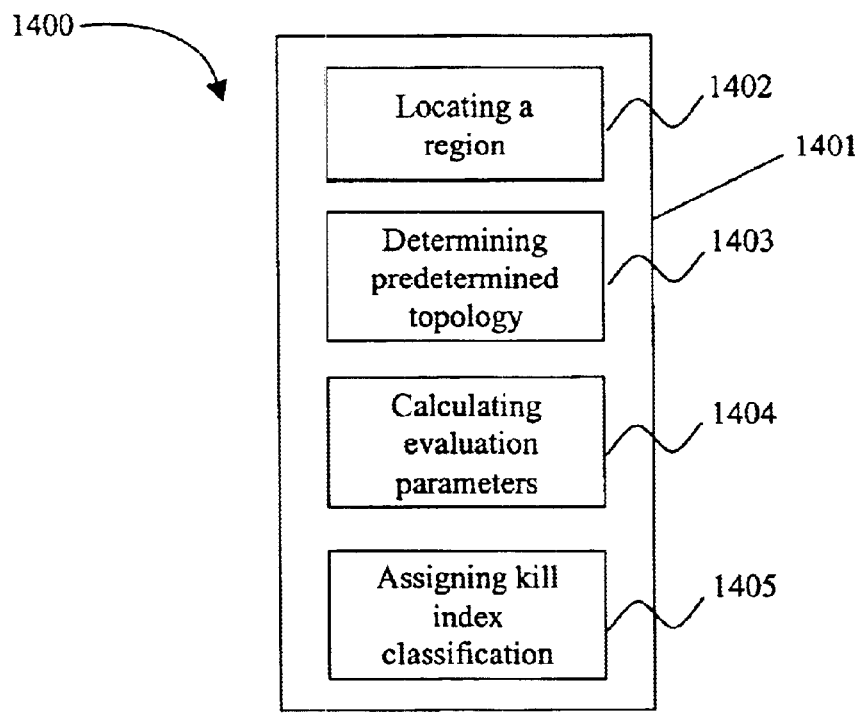
FIG. 14 illustrates a schematic view of a machine-readable program storage device, tangibly embodying a program of instructions executable by the machine to perform method steps for the kill index classification method of the present invention.

Turning to FIG. 13, the present invention also relates to a computer program product 1300 including a computer usable medium having computer readable program code 1301 embodied therein for a kill index classification method for prioritizing relational aspects of topological defect intersections, the computer readable program code in the article of manufacture including at least one program code selected from:

a) first computer readable program code 1302 for causing a computer to locate a region having at least one non-predetermined portion therein;

b) tied to the first computer readable software, second computer readable program code 1303 for causing the computer to determine a predetermined topology for the region;

c) tied to the second computer readable software, third computer readable program code 1304 for causing the computer to calculate evaluation parameters based on the at least one non-predetermined portion in relation to the predetermined topology for the region; and d) tied to the third computer readable software, fourth computer readable program code 1305 for causing the computer to assign a kill index classification using the calculated evaluation parameters;

Turning now to FIG. 14, the present invention further relates to a program storage device 1401 readable by machine, tangibly embodying a program of instructions executable by the machine to perform method steps for a kill index classification method for prioritizing relational aspects of topological defect intersections, the method steps including at least one step selected from:

a) locating (step 1402) a region having at least one non-predetermined portion therein;

b) determining (step 1403) a predetermined topology for the region;

c) calculating (step 1404) evaluation parameters based on the at least one non-predetermined portion in relation to the predetermined topology for the region; and d) assigning (step 1405) a kill index classification using the calculated evaluation parameters.

Figure 15:
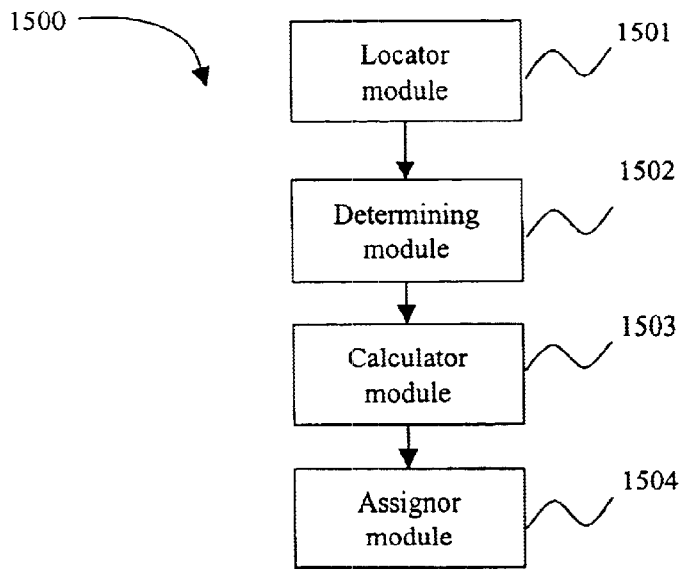
FIG. 15 illustrates a schematic view of an apparatus for using the kill index classification method of the present invention.

Turning now to FIG. 15, the present invention additionally relates to apparatus 1500 for using a kill index classification method for prioritizing relational aspects of topological defect intersections, wherein the method is especially useful in association with an intermediate analytical testing stage of a multi-stage semiconductor fabrication process, wherein the apparatus includes a) a locator module 1501 for locating a region having at least one non-predetermined portion therein;

b) in communication with the locator module, a determiner module 1502 for determining a predetermined topology for the region;

c) in communication with the determiner module, a calculator module 1503 for calculating evaluation parameters based on the at least one non-predetermined portion in relation to the predetermined topology for the region; and d) in communication with the calculator module, an assignor module 1504 for assigning a kill index classification using the calculated evaluation parameters.

Figure 16:
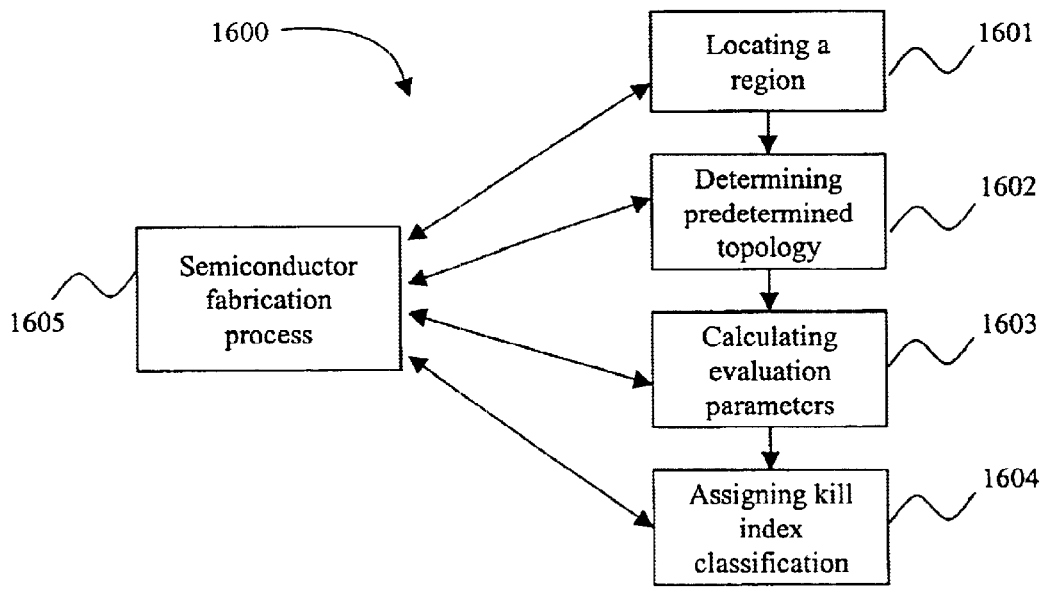
FIG. 16 illustrates a schematic view of a system for operating a multi-stage semiconductor fabrication process wherein is included at least one embodiment of the kill index classification method of the present invention.

Furthermore, turning to FIG. 16 the present invention relates to a system 1600 for operating a multi-stage semiconductor fabrication process 1605—such as indicated in 100A—in association with at least two intermediate analytical testing stages, wherein each stage is using a kill index classification method for prioritizing relational aspects of topological defect intersections, wherein said system includes a management module for operating a multi-stage semiconductor fabrication process and associated with the management module there are at least two apparatus for using a kill index classification method for prioritizing relational aspects of topological defect intersections, and each said apparatus includes:

a) a locator module 1601 for locating a region having at least one non-predetermined portion therein;

b) in communication with the locator module, a determiner module 1602 for determining a predetermined topology for the region;

c) in communication with the determiner module, a calculator module 1603 for calculating evaluation parameters based on the at least one non-predetermined portion in relation to the predetermined topology for the region; and d) in communication with the calculator module, an assignor module 1604 for assigning a kill index classification using the calculated evaluation parameters.

While the present invention has been described in detail above with reference to several embodiments, various modifications within the spirit of the invention will be apparent to those of working skill in this technological field. Accordingly, the scope of the invention is to be determined by the appended claims.

What is claimed is:

1. A computer program product including a computer usable medium having computer readable program code embodied therein for a kill index classification method for prioritizing relational aspects of topological defect intersections in a semiconductor fabrication process, the computer readable program code in said computer usable medium including at least one program code selected from:
   a) first computer readable program code for causing a computer to locate a region having at least one non-predetermined portion therein;
   b) tied to the first computer readable program code, second computer readable program code for causing the computer to determine a predetermined topology for the region;
   c) tied to the second computer readable program code, third computer readable program code for causing the computer to calculate evaluation parameters based on the at least one non-predetermined portion in relation to the predetermined topology for the region; and
   d) tied to the third computer readable program code, fourth computer readable program code for causing the computer to assign a kill index classification using the calculated evaluation parameters;

wherein the kill index classification method includes the steps of
   a) locating a region having at least one non-predetermined portion therein;
   b) determining a predetermined topology for the region;
   c) calculating evaluation parameters based on the at least one non-predetermined portion in relation to the predetermined topology for the region; and
   d) assigning a kill index classification using the calculated evaluation parameters.

2. Apparatus for performing a kill index classification method for prioritizing relational aspects of topological defect intersections in a semiconductor fabrication process, wherein said apparatus includes:
   a) a locator module for locating a region having at least one non-predetermined portion therein;
   b) in communication with the locator module, a determiner module for determining a predetermined topology for the region;
   c) in communication with the determiner module, a calculator module for calculating evaluation parameters based on the at least one non-predetermined portion in relation to the predetermined topology for the region; and
   d) in communication with the calculator module, an assignor module for assigning a kill index classification using the calculated evaluation parameters.

3. A system for operating a multi-stage semiconductor fabrication process in association with at least two intermediate analytical testing stages, wherein, at each stage, a kill index classification method is performed for prioritizing relational aspects of topological defect intersections, wherein said system includes a management module for operating said multi-stage semiconductor fabrication process, and wherein, in association with the management module, there are at least two apparatus for using a kill index classification method for prioritizing relational aspects of topological defect intersections, and each said apparatus includes:
   a) a locator module for locating a region having at least one non-predetermined portion therein;
   b) in communication with the locator module, a determiner module for determining a predetermined topology for the region;
   c) in communication with the determiner module, a calculator module for calculating evaluation parameters based on the at least one non-predetermined portion in relation to the predetermined topology for the region; and
   d) in communication with the calculator module, an assignor module for assigning a kill index classification using the calculated evaluation parameters.

4. A method according to claim 1, wherein said semiconductor fabrication process is a multi-stage semiconductor fabrication process, and wherein said kill index classification method is performed after each stage of said multi-stage semiconductor fabrication process.

5. A method according to claim 2, wherein said semiconductor fabrication process is a multi-stage semiconductor fabrication process, and wherein said kill index classification method is performed after each stage of said multi-stage semiconductor fabrication process.

* * * * *